United States Patent
Park et al.

(10) Patent No.: US 9,502,406 B1
(45) Date of Patent: Nov. 22, 2016

(54) SEMICONDUCTOR DEVICE AND METHOD OF FABRICATING THE SAME

(71) Applicants: Cheolwoo Park, Hwaseong-si (KR); Kwangyul Lee, Suwon-si (KR); Jeongeon Lee, Suwon-si (KR); Seokjun Won, Seoul (KR); Hyungsuk Jung, Suwon-si (KR)

(72) Inventors: Cheolwoo Park, Hwaseong-si (KR); Kwangyul Lee, Suwon-si (KR); Jeongeon Lee, Suwon-si (KR); Seokjun Won, Seoul (KR); Hyungsuk Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/838,999

(22) Filed: Aug. 28, 2015

Related U.S. Application Data

(63) Continuation of application No. 14/331,715, filed on Jul. 15, 2014, now Pat. No. 9,190,272.

(51) Int. Cl.
*H01L 27/088* (2006.01)
*H01L 29/49* (2006.01)
*H01L 29/51* (2006.01)
*H01L 29/66* (2006.01)

(52) U.S. Cl.
CPC .......... *H01L 27/088* (2013.01); *H01L 29/495* (2013.01); *H01L 29/4966* (2013.01); *H01L 29/517* (2013.01); *H01L 29/66545* (2013.01)

(58) Field of Classification Search
CPC .............. H01L 27/088; H01L 29/495; H01L 29/4966; H01L 29/517; H01L 29/66545; H01L 21/02063; H01L 21/033
USPC ........................................................ 438/275
See application file for complete search history.

(56) References Cited

U.S. PATENT DOCUMENTS

| | | | |
|---|---|---|---|
| 6,417,052 B1 | 7/2002 | Tsujikawa et al. | |
| 6,445,047 B1 | 9/2002 | Yamada et al. | |
| 6,664,592 B2 | 12/2003 | Inumiya et al. | |
| 6,812,535 B2 | 11/2004 | Yagishita et al. | |
| 8,048,733 B2 | 11/2011 | Yeh et al. | |
| 8,242,558 B2 | 8/2012 | Yamakawa | |
| 8,298,011 B2 | 10/2012 | Tateshita | |
| 8,334,198 B2 | 12/2012 | Chen et al. | |
| 2002/0008261 A1* | 1/2002 | Nishiyama | H01L 21/28562 257/288 |
| 2003/0107088 A1 | 6/2003 | Inumiya et al. | |
| 2003/0228725 A1 | 12/2003 | Tsujikawa et al. | |
| 2004/0004234 A1 | 1/2004 | Yagishita et al. | |
| 2005/0170659 A1 | 8/2005 | Hanafi et al. | |
| 2005/0272191 A1 | 12/2005 | Shah et al. | |
| 2007/0126067 A1* | 6/2007 | Hattendorf | H01L 21/26586 257/412 |
| 2008/0087966 A1* | 4/2008 | Tai | H01L 21/82384 257/369 |

(Continued)

FOREIGN PATENT DOCUMENTS

JP 2008016522 A 1/2008
KR 100451038 B1 10/2004

*Primary Examiner* — Allan R Wilson
(74) *Attorney, Agent, or Firm* — Harness, Dickey & Pierce, P.L.C.

(57) ABSTRACT

Provided is a semiconductor device and method of fabricating the same. The device includes a substrate including a first region and a second region, a first gate pattern on the first region, a second gate pattern on the second region, and an interlayer insulating layer enclosing the first and second gate patterns. The first gate pattern including a first gate insulating layer and a first gate electrode, the second gate pattern including a second gate insulating layer and a second gate electrode, the first gate insulating layer is thicker than the second gate insulating layer, and a top width of the second gate pattern is larger than a bottom width thereof.

17 Claims, 8 Drawing Sheets

(56) References Cited

U.S. PATENT DOCUMENTS

| | | | |
|---|---|---|---|
| 2009/0004799 A1* | 1/2009 | Wirbeleit | H01L 21/82384 438/275 |
| 2009/0321820 A1 | 12/2009 | Yamakawa | |
| 2010/0127336 A1 | 5/2010 | Chambers et al. | |
| 2011/0183485 A1 | 7/2011 | Tateshita | |
| 2011/0306196 A1 | 12/2011 | Hsu et al. | |
| 2012/0034747 A1 | 2/2012 | Lin | |
| 2012/0264281 A1 | 10/2012 | Chen et al. | |
| 2013/0049924 A1 | 2/2013 | Yang et al. | |
| 2013/0237046 A1 | 9/2013 | Lin et al. | |
| 2013/0244414 A1 | 9/2013 | Song et al. | |
| 2013/0244443 A1 | 9/2013 | Mizutani et al. | |
| 2014/0179076 A1 | 6/2014 | Shinohara | |
| 2014/0349471 A1* | 11/2014 | Chiang | H01L 21/28114 438/587 |

* cited by examiner

SEMICONDUCTOR DEVICE AND METHOD OF FABRICATING THE SAME

This application is a continuation of U.S. application Ser. No. 14/331,715, filed on Jul. 15, 2014, the entire contents of which are hereby incorporated by reference.

BACKGROUND

Example embodiments of the inventive concepts relate to a semiconductor device and a method of fabricating the same.

As a feature size of a MOS transistor is scaled down, a width of a gate pattern and/or a length of a channel region are decreasing. Various studies have been conducted to overcome consequent technical difficulties and/or improve an operational property of the MOS transistor.

For example, a device of which a gate insulating layer and a gate electrode are formed of a high-k dielectric and a metal layer, respectively, is being studied. Since the metal layer has a poor heat-resistant property, a damascene process may be used to form the gate electrode of the device. Further, in order to realize devices with different performance on a semiconductor substrate, the devices may be formed to have gate insulating layers, whose thicknesses are different between device regions.

SUMMARY

Example embodiments of the inventive concepts provide a semiconductor device with improved electric characteristics.

Other example embodiments of the inventive concepts provide a method of fabricating a semiconductor device with improved electric characteristics.

According to example embodiments of the inventive concept, a semiconductor device may include a substrate including a first region and a second region, a first gate pattern on the first region, the first gate pattern including a first gate insulating layer and a first gate electrode, a second gate pattern on the second region, the second gate pattern including a second gate insulating layer and a second gate electrode, and an interlayer insulating layer enclosing the first and second gate patterns. The first gate insulating layer may be thicker than the second gate insulating layer, and a top width of the second gate pattern may be larger than a bottom width thereof.

According to example embodiments of the inventive concepts, a method of fabricating a semiconductor device may include providing a substrate with a first region and a second region, forming dummy gate patterns on the substrate, each of the dummy gate patterns including a first gate insulating layer, a dummy layer, and a hard mask, forming an interlayer insulating layer on the substrate to expose top surfaces of the dummy gate patterns, removing the hard mask and the dummy layer to form a first trench and a second preliminary trench exposing the first gate insulating layer on the first and second regions, respectively, forming a photoresist pattern on the first region provided with the first trench to expose the second preliminary trench on the second region, removing a portion of the first gate insulating layer from the second preliminary trench to form a second trench exposing a portion of the substrate, cleaning the portion of the substrate exposed by the second trench using an oxide etching solution, removing the photoresist pattern from the first region, forming a second gate insulating layer on the portion of the substrate exposed by the second trench, and forming gate electrodes on the first and second gate insulating layers, respectively.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
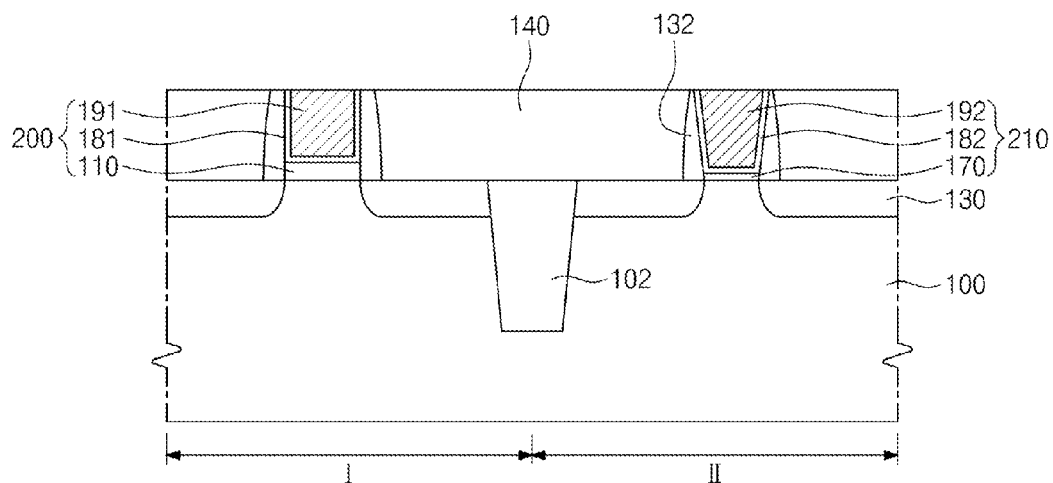
FIG. 1 is a sectional view illustrating a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in the three different directions as would be illustrated in a perspective view. The two different directions may or may not be orthogonal to each other. The three different directions may include a third direction that may be orthogonal to the two different directions. The plurality of the device structures may be integrated in a same electronic device. For example, when a device (e.g., a memory cell structure or a transistor structure) is illustrated in a cross-sectional view, an electronic device may include a plurality of the device structures (e.g. memory cell structures or transistor structures), as would be illustrated by a plan view of the electronic device. The plurality of device structures may be arranged in an array and/or in a two-dimensional pattern.

FIG. 1 is a sectional view illustrating a semiconductor device according to example embodiments of the inventive concepts.

Referring to FIG. 1, a semiconductor device according to example embodiments of the inventive concepts may include a substrate 100, a first gate pattern 200, a second gate pattern 210, and/or an interlayer insulating layer 140. The first and second gate patterns 200 and 210 and the interlayer insulating layer 140 are provided on the substrate 100. The semiconductor device may further include a device isolation layer 102 and source/drain regions 130 provided in the substrate 100.

The substrate 100 may include first and second regions I and II that are partly defined by the device isolation layer 102. Transistors may be integrated on the substrate 100. Here, there may be a difference in electric characteristics between the transistors provided on the first and second regions I and II, respectively. For example, a high-voltage transistor may be formed on the first region I, and a low-voltage transistor may be formed on the second region II.

The substrate 100 may be a silicon substrate, for example, a bulk silicon wafer or a silicon-on-insulator (SOI) wafer. In other example embodiments, the substrate 100 may include a semiconductor material other than silicon. For example, the substrate 100 may be formed of or include at least one of germanium, indium antimonide, lead telluride, indium arsenide, indium phosphide, gallium arsenide, or gallium antimonide.

The device isolation layer 102 may be formed of or include at least one of insulating materials (for example, silicon oxide).

The first gate pattern 200 may be provided on the first region I and may be used as a part of the high-voltage transistor, and the second gate pattern 210 may be provided on the second region II and may be used as a part of the low-voltage transistor.

The first gate pattern 200 may include a first gate insulating layer 110, a first high-k dielectric pattern 181, and/or a first gate electrode 191. The second gate pattern 210 may include a second gate insulating layer 170, a second high-k dielectric pattern 182, and/or a second gate electrode 192. The high-k dielectric patterns 181 and 182 may be formed to cover side and bottom surfaces of the gate electrodes 191 and 192, respectively. Bottom and top surfaces of the first gate pattern 200 may have substantially the same width. By contrast, the second gate pattern 210 may have a width increasing in a direction away from the substrate 100. For example, the width of the second gate pattern 210 may be greater at a top surface thereof than at a bottom surface thereof. The widths of the gate patterns 200 and 210 may be values measured in the channel length direction. Further, the top surfaces of the first and second gate patterns 200 and 210 may be coplanar with that of the interlayer insulating layer 140. Each of the gate electrodes 191 and 192 may include a metal layer. For example, the metal layer for the gate electrodes 191 and 192 may be formed of or include at least one of titanium, titanium nitride, tantalum, tantalum nitride, tungsten, copper, aluminum, or mixtures thereof.

The first gate insulating layer 110 may be thicker than the second gate insulating layer 170. At least one or each of the gate insulating layers 110 and 170 may include a silicon oxide layer. A spacer 132 may be provided on sidewalls of the first and second gate electrode patterns 200 and 210. The spacer 132 may include a silicon nitride layer.

Hereinafter, a method of fabricating a semiconductor device according to example embodiments of the inventive concepts will be described with reference to FIGS. 2 through 13. FIGS. 2 through 13 are sectional views illustrating the method of fabricating a semiconductor device according to example embodiments of the inventive concepts.

Figure 2:
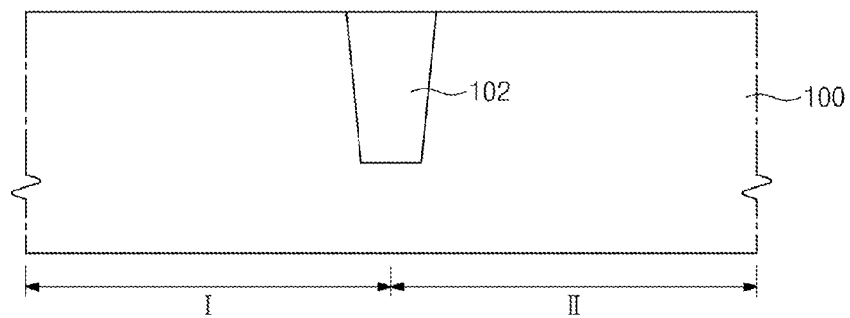
FIGS. 2 through 13 are sectional views illustrating a method of fabricating a semiconductor device according to example embodiments of the inventive concept.

Referring to FIG. 2, a device isolation layer 102 may be formed in a substrate 100 to define or section each device region.

The substrate 100 may be a silicon substrate, for example, a bulk silicon wafer or a silicon-on-insulator (SOI) wafer. In other embodiments, the substrate 100 may include a semiconductor material other than silicon. For example, the substrate 100 may be formed of or include at least one of germanium, indium antimonide, lead telluride, indium arsenide, indium phosphide, gallium arsenide, or gallium antimonide.

The substrate 100 may include a first region I and a second region II that are partly defined or delimited by the device isolation layer 102. At least one transistor may be integrated on each of the first and second regions I and II of the substrate 100. In example embodiments, there may be a difference in electric characteristics between the transistors that are formed on the first and second regions I and II, respectively. For example, a high-voltage transistor may be formed on the first region I, and a low-voltage transistor may be formed on the second region II.

The device isolation layer 102 may be formed of or include at least one of insulating materials (for example, silicon oxide).

Figure 3:
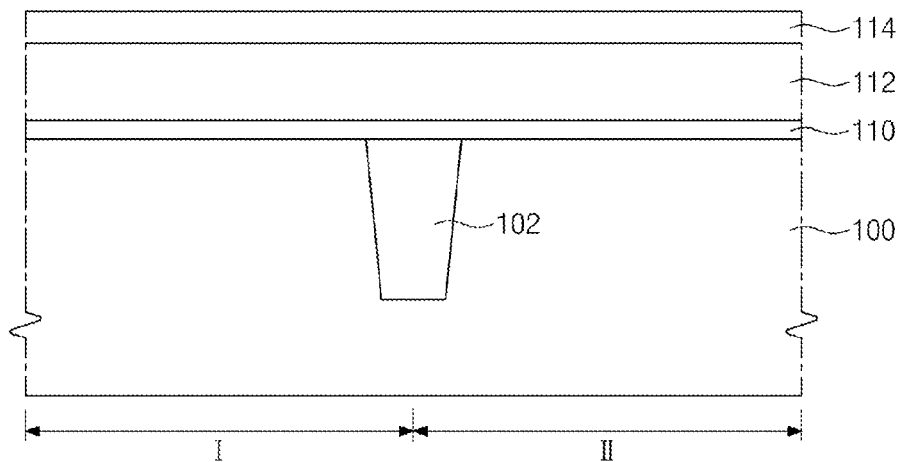

Referring to FIG. 3, a first gate insulating layer 110, a dummy layer 112, and a hard mask 114 may be sequentially formed on the substrate 100 provided with the device isolation layer 102.

The first gate insulating layer 110 may be formed using a dry oxidation process or a radical oxidation process. In the dry oxidation process or the radical oxidation process, the substrate 100 may be oxidized using oxygen gas ($O_2$) and hydrogen gas ($H_2$). In example embodiments, where the substrate 100 is formed of silicon, a silicon oxide layer serving as the first gate insulating layer 110 may be formed on the substrate 100. The dummy layer 112 may be formed of or include polysilicon. For example, the dummy layer 112 may be formed by a chemical vapor deposition (CVD) process, in which silane ($SiH_4$) or disilane ($Si_2H_6$) is used as a source gas. The hard mask 114 may be formed of or include silicon nitride.

Figure 4:
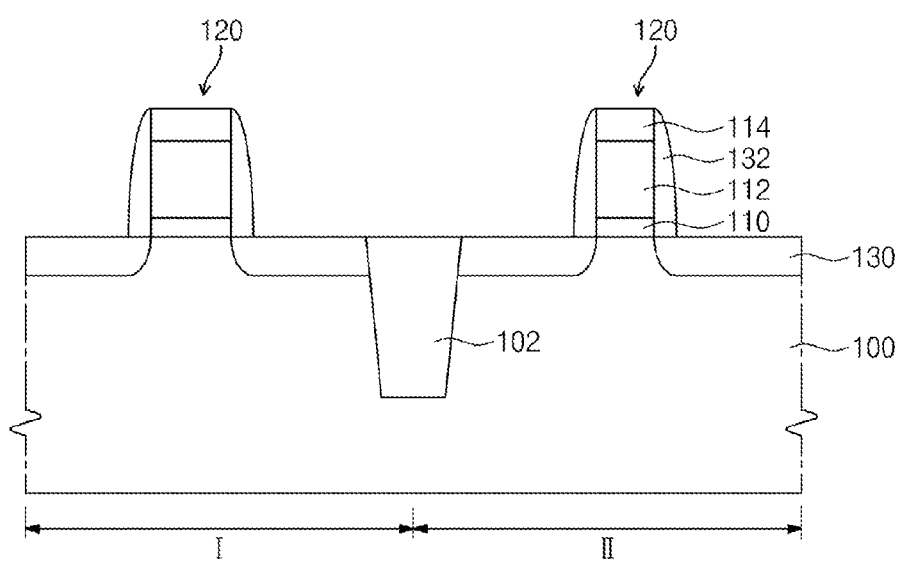

Referring to FIG. 4, the first gate insulating layer 110, the dummy layer 112, and the hard mask 114 may be patterned to form dummy gate patterns 120 on the substrate 100.

The formation of the dummy gate patterns 120 may include using a photoresist pattern (not shown) on the hard mask 114 as an etch mask. Each of the dummy gate patterns 120 may include the first gate insulating layer 110, the dummy layer 112, and the hard mask 114.

Thereafter, source/drain regions 130 may be formed by, for example, an ion implantation process. In example embodiments, the dummy gate patterns 120 may be used as an injection mask in the ion implantation process. For example, the source/drain regions 130 may be formed in the substrate 100 at both sides of each dummy gate pattern 120.

Next, a spacer 132 may be formed on a sidewall of each of the dummy gate patterns 120. The spacer 132 may be formed of or include silicon nitride.

Figure 5:
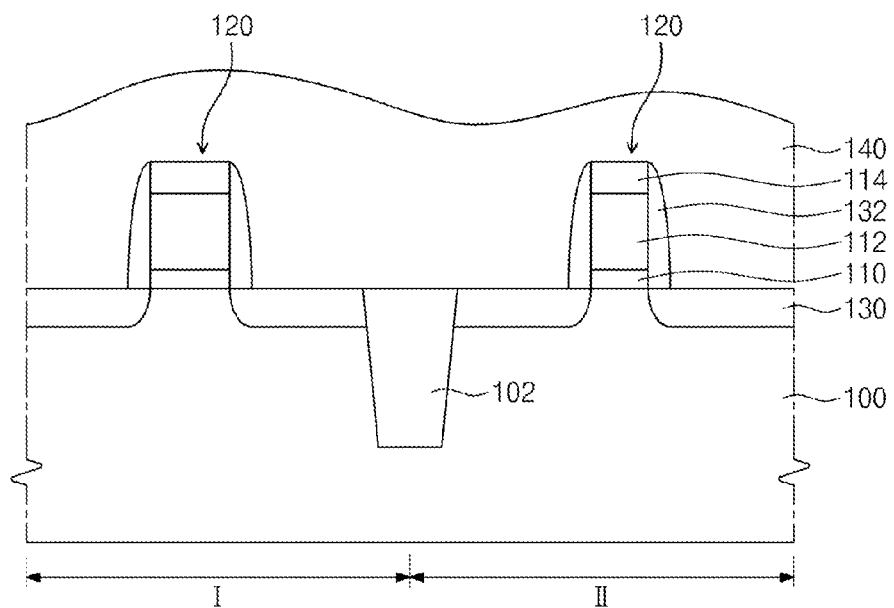

Referring to FIG. 5, an interlayer insulating layer 140 may be formed on the substrate 100 to cover the dummy gate patterns 120 and the spacer 132.

The interlayer insulating layer 140 may be a silicon oxide layer, which may be formed by a high density plasma chemical vapor deposition (HDP-CVD) or a flowable chemical vapor deposition (FCVD) process. For example, the interlayer insulating layer 140 may include at least one of high density plasma (HDP) oxide, Tetra Ethyl Ortho Silicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin-on-glass (SOG), Tonen SilaZene (TOSZ), or combinations thereof.

Figure 6:
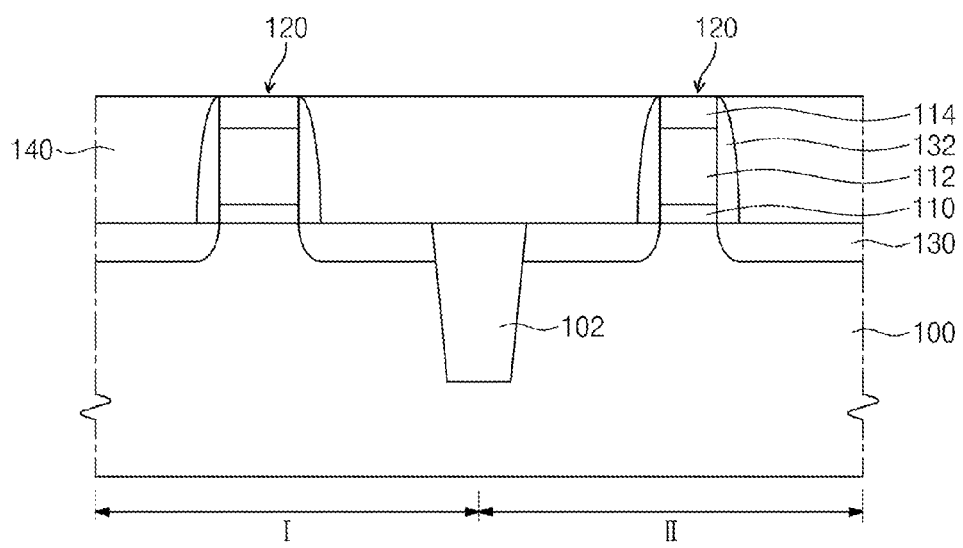

Referring to FIG. 6, a first planarization process may be performed on the interlayer insulating layer 140.

The first planarization process may be performed using a chemical mechanical polishing (CMP) technology. In example embodiments, the hard mask 114 may be used as an endpoint in the first planarization process. Accordingly, a top surface of the hard mask 114 may be exposed.

Figure 7:
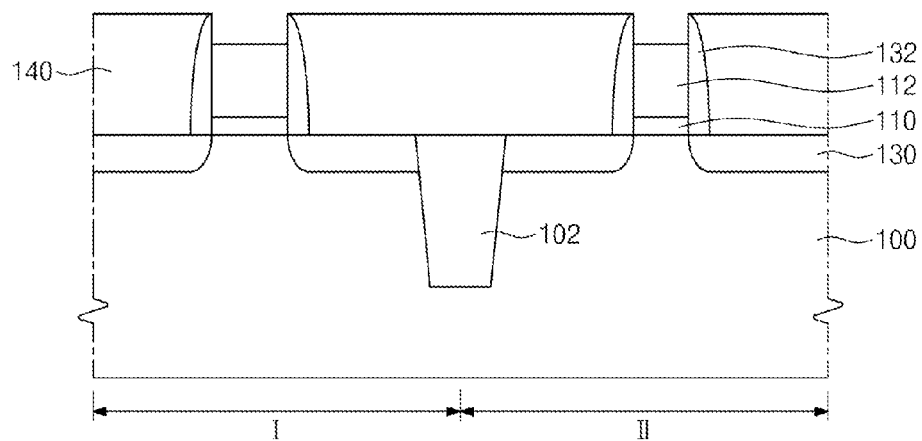

Referring to FIG. 7, the hard mask 114 may be removed from top surfaces of the dummy gate patterns 120.

The removal of the hard mask 114 may be performed using an etch-back process. As a result of removing the hard mask 114, the top surface of the dummy layer 112 and a portion of a sidewall of the spacer 132 may be exposed.

Figure 8:
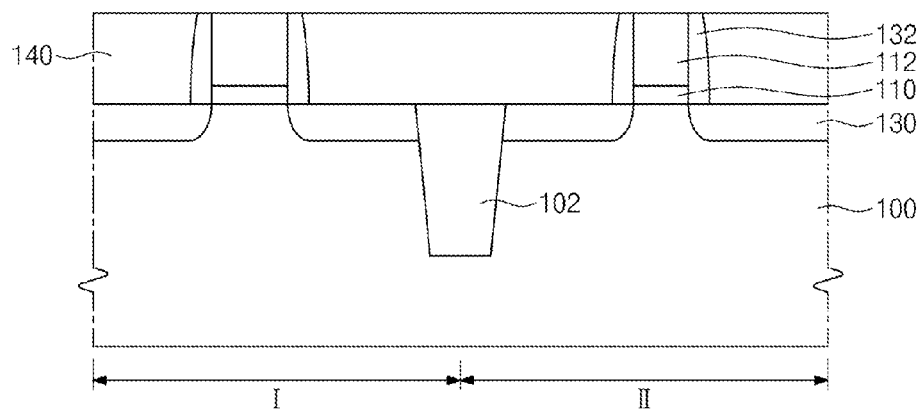

Referring to FIG. 8, a second planarization process may be performed to planarize the interlayer insulating layer 140, the spacer 132, and the dummy layer 112.

The second planarization process may be performed using a chemical mechanical polishing (CMP) technology. In example embodiments, the dummy layer 112 may be used as an endpoint in the second planarization process. Accordingly, a top surface of the upper dummy layer 112 may be exposed.

Figure 9:
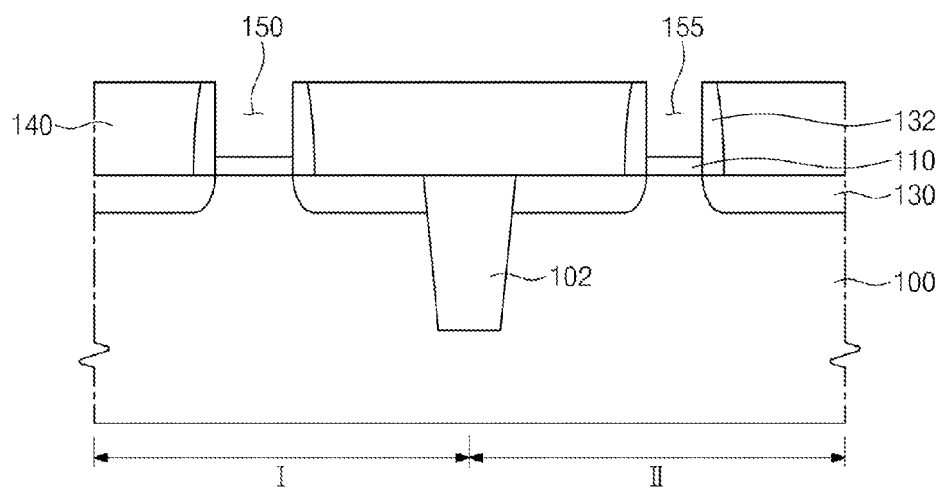

Referring to FIG. 9, the exposed dummy layer 112 may be removed to form a first trench 150 and a second preliminary trench 155 on the first and second regions I and II, respectively.

As a result of removing the dummy layer 112, the first gate insulating layer 110 may be exposed through the first trench 150 and the second preliminary trench 155.

Figure 10:
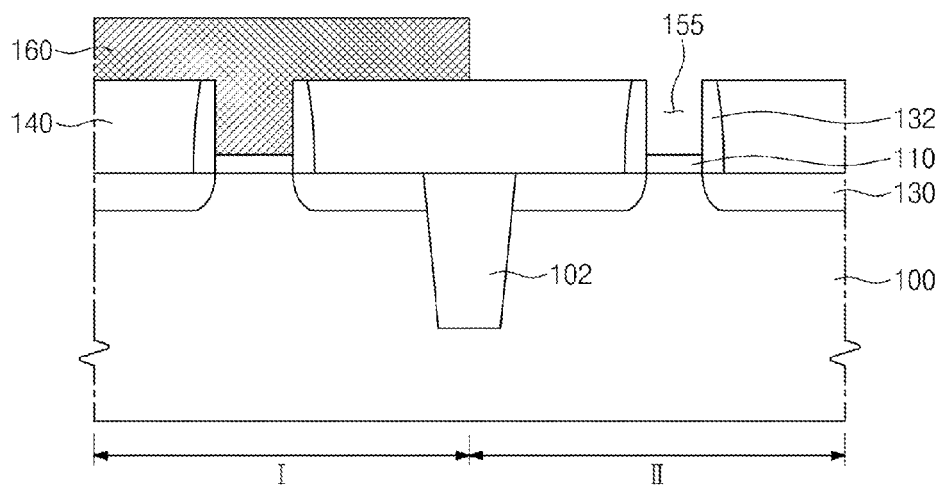

Referring to FIG. 10, a photoresist pattern 160 may be formed on the interlayer insulating layer 140 to cover at least a portion of the first region I and expose at least a portion of the second region II.

For example, the photoresist pattern 160 may be formed to wholly cover the first region I and may further include a portion extending onto the second region II. Alternatively, the photoresist pattern 160 may be formed on the first region I to cover the first trench 150 and a portion of a region adjacent to the first trench 150. In other words, if the photoresist pattern 160 is formed to allow for a selective removal of a portion of the first gate insulating layer 110 that is exposed by the second preliminary trench 155 of the second region II, a position and an area of the photoresist pattern 160 may be variously changed.

Figure 11:
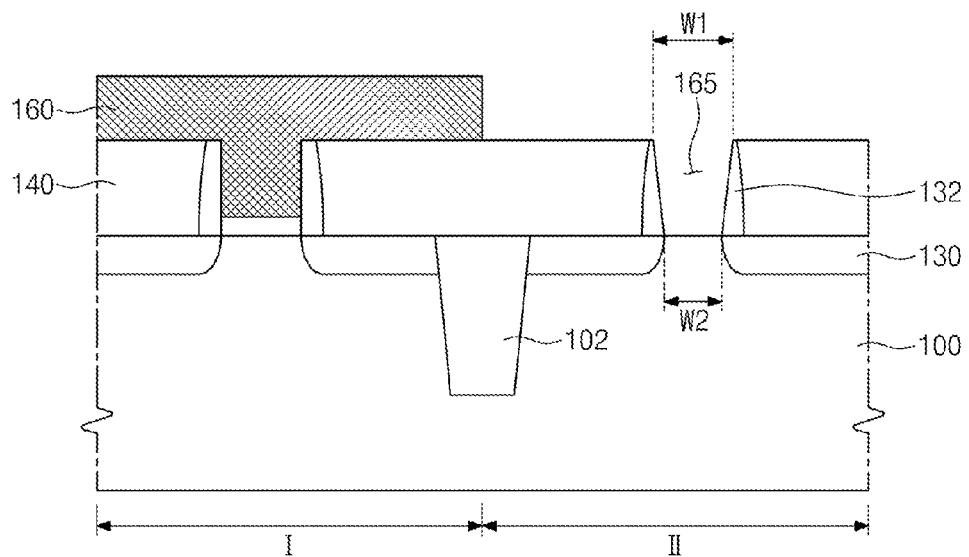

Referring to FIG. 11, a portion of the first gate insulating layer 110 may be removed from the second region II to form a second trench 165. The formation of the second trench 165 may include etching the portion of the first gate insulating layer 110 using the photoresist pattern 160 as an etch mask.

In example embodiments, the first gate insulating layer 110 may be removed by a chemical oxide removal (COR) process using HF and $NH_3$ gas. A portion of the spacer 132 exposed by the second preliminary trench 155 may be etched during the removal of the first gate insulating layer 110. As a result of removing of the first gate insulating layer 110, the second trench 165 may be formed to expose the substrate. The second trench 165 may be formed to have a top entrance and a bottom surface whose widths are w1 and w2, respectively, when measured in a channel length direction. The second trench 165 may be formed to have a width increasing in a direction away from the substrate 100 or normal to the top surface of the substrate 100. In other words, the top width w1 of the second trench 165 may be greater than the bottom width w2 thereof. Due to such a shape of the second trench 165, the second trench 165 can be easily filled with a metal layer in a subsequent process, without a seam.

A residue may be produced in the process of removing the first gate insulating layer 110. For example, a residue originated from the first gate insulating layer 110 may remain at bottom corners of the second trench 165. The residue may serve as a defect source in a subsequent process and may lead to deterioration in electric characteristics of the semiconductor device. Thus, a cleaning process may be additionally performed to completely remove the residue and thereby to reduce or prevent defects from occurring. In other words, by performing the cleaning process, it is possible to improve the electric characteristics of the semiconductor device. The cleaning process may be performed using oxide etching solution. For example, the oxide etching solution may contain dilute aqueous HF solution or buffered oxide etchant (BOE) solution. Thereafter, the photoresist pattern 160 may be removed.

Figure 12:
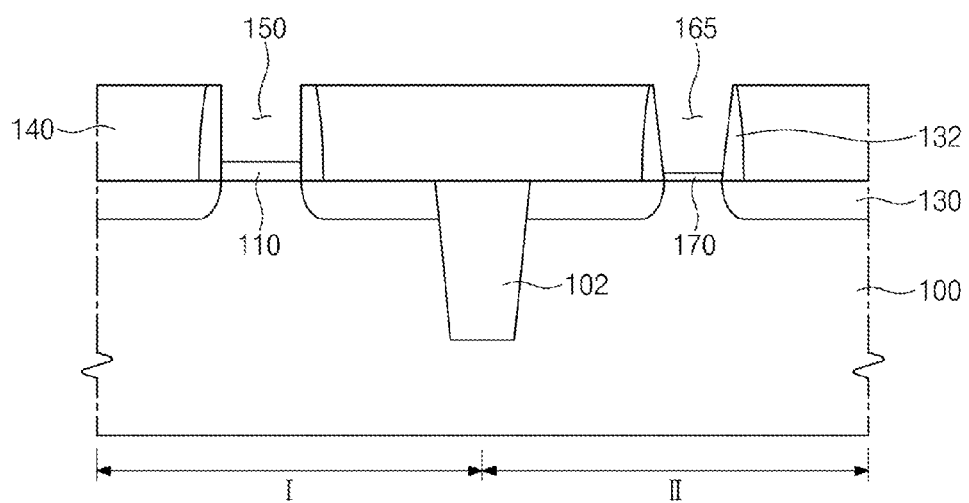

Referring to FIG. 12, a second gate insulating layer 170 may be formed on the substrate 100 exposed by the second trench 165.

The second gate insulating layer 170 may be formed to be thinner than the first gate oxide 110 formed on the first trench 150 of the first region I. In example embodiments, where the substrate 100 is formed of silicon, the formation of the second gate insulating layer 170 may include oxidizing the exposed surface of the substrate 100 using ozone (O3) gas. In example embodiments, the second gate insulating layer 170 may include a silicon oxide layer.

Figure 13:
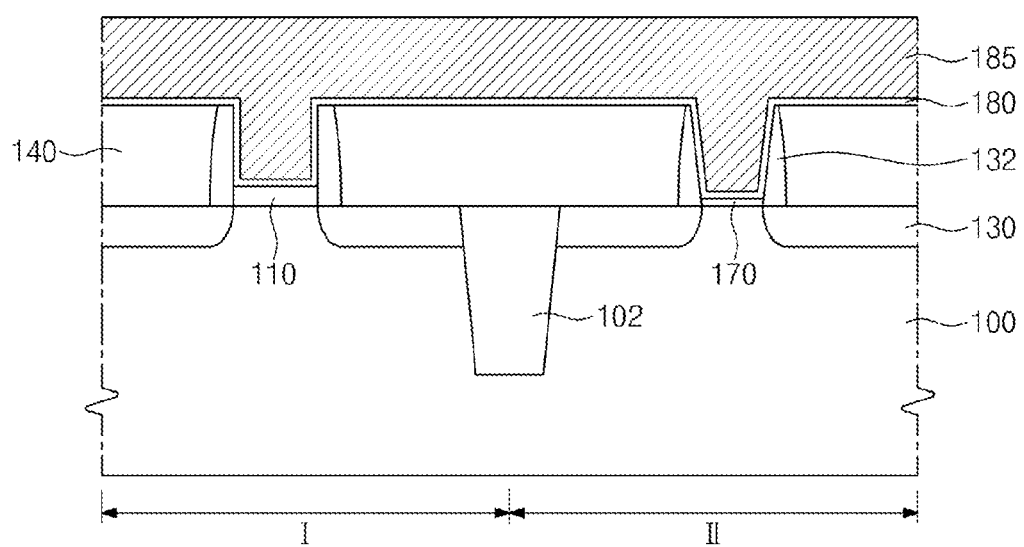

Referring to FIG. 13, a high-k dielectric 180 and a metal layer 185 may be sequentially formed on the substrate 100 with the second gate insulating layer 170.

The high-k dielectric 180 may be formed to conformally cover side surfaces of the first and second trenches 150 and 165 and top surfaces of the first and second gate insulating layers 110 and 170. The metal layer 185 may be formed on the high-k dielectric 180 to fill the first and second trenches 150 and 165 provided with the high-k dielectric 180. A barrier metal layer (not shown) may be further formed between the metal layer 185 and the high-k dielectric 180.

The high-k dielectric 180 may be formed using an atomic layer deposition (ALD) process. The high-k dielectric 180 may include at least one high-k dielectric material, whose dielectric constant is higher than that of silicon oxide. For example, the high-k dielectric 180 may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The metal layer 185 may be formed of or include at least one of titanium, titanium nitride, tantalum, tantalum nitride, tungsten, copper, aluminum, or mixtures thereof.

Referring back to FIG. 1, the metal layer 185 and the high-k dielectric 180 may be planarized to expose the interlayer insulating layer 140 and form first and second gate patterns 200 and 210 in the first and second trenches 150 and 165, respectively.

The first gate pattern 200 may include the first gate insulating layer 110, a first high-k dielectric pattern 181, and a first gate electrode 191, which are sequentially stacked in the first trench 150. Here, the first high-k dielectric pattern 181 and the first gate electrode 191 may be portions of the high-k dielectric 180 and the metal layer 185 that are localized within the first trench 150 after the planarization process. The second gate pattern 210 may include the second gate insulating layer 170, a second high-k dielectric pattern 182, and a second gate electrode 192, which are sequentially stacked in the second trench 165. Here, the second high-k dielectric pattern 182 and the second gate electrode 192 may be portions of the high-k dielectric 180 and the metal layer 185 that are localized within the second trench 165 after the planarization process.

The planarization process may include performing an etch-back or CMP process on the metal layer 185 and the high-k dielectric 180.

The first and second gate electrodes 191 and 192 may include at least one of titanium (Ti), titanium nitride (TiN), tantalum (Ta), tantalum nitride (TaN), tungsten (W), copper (Cu), aluminum (Al), or mixtures thereof. As a result of the formation of the first and second gate electrodes 191 and 192, a high-voltage transistor with the first gate insulating layer 110 may be formed on the first region I, and a low-voltage transistor with the second gate insulating layer 170 may be formed on the second region II. Thereafter, an interconnection structure (not shown) may be further formed on the interlayer insulating layer 140 to electrically connect the transistors to each other.

According to example embodiments of the inventive concepts, by using the afore-described method, defect-free, high-quality gate insulating layers can be formed on two separate regions of the substrate 100 to have thicknesses different from each other.

Figure 14:
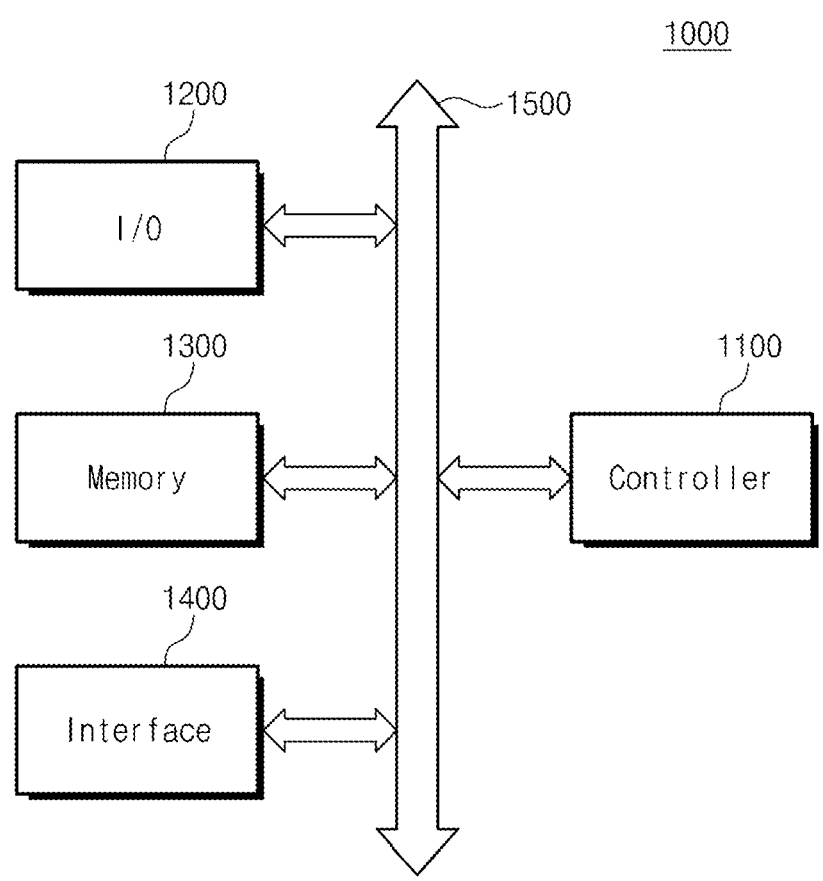
FIG. 14 is a block diagram illustrating an example of electronic systems including a semiconductor device according to example embodiments of the inventive concept.

FIG. 14 is a block diagram schematically illustrating an example of electronic systems including a semiconductor device according to example embodiments of the inventive concept.

Referring to FIG. 14, an electronic system 1000 according to example embodiments of the inventive concept may include a controller 1100, an input/output (I/O) unit 1200, a memory device 1300, an interface unit 1400, and a data bus 1500. At least two of the controller 1100, the I/O unit 1200, the memory device 1300 and the interface unit 1400 may communicate with each other through the data bus 1500. The data bus 1500 may correspond to a path through which electrical signals are transmitted.

The controller 1100 may include at least one of a microprocessor, a digital signal processor, a microcontroller, or a logic device. The logic device may be configured to have a similar function to any one of the microprocessor, the digital signal processor, and the microcontroller. The I/O unit 1200 may include a keypad, a keyboard, or a display unit. The memory device 1300 may store data and/or commands. The interface unit 1400 may transmit electrical data to a communication network or may receive electrical data from a communication network. The interface unit 1400 may operate in a wireless or wired manner. For example, the interface unit 1400 may include an antenna for wireless communication or a transceiver for wired communication. Although not shown in the drawings, the electronic system 1000 may further include a fast DRAM device and/or a fast SRAM device that acts as a cache memory for improving an operation of the controller 1100. The semiconductor device according to example embodiments of the inventive concept may be provided in the memory device 1300 or as a part of the controller 1100, the I/O unit 1200.

The electronic system 1000 may be applied to a personal digital assistant (PDA), a portable computer, a web tablet, a wireless phone, a mobile phone, a digital music player, a memory card or an electronic product. The electronic product may receive or transmit information data by wireless.

According to example embodiments of the inventive concepts, the use of the afore-described method makes it possible to form defect-free, high-quality gate insulating layers, whose thicknesses are different from each other, on two separate regions (for example, the first and second regions) of the substrate 100.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a first region and a second region;
   a first trench and a second trench disposed on the first and second regions, respectively;
   a first gate pattern provided in the first trench, the first gate pattern including a first gate insulating layer and a first gate electrode;
   a second gate pattern provided in the second trench, the second gate pattern including a second gate insulating layer and a second gate electrode; and
   an interlayer insulating layer enclosing the first and second gate patterns,
   wherein the first gate insulating layer is thicker than the second gate insulating layer,
   wherein the second trench has a width increasing in a direction away from the substrate, and
   wherein a top entrance and a bottom surface of the first trench have substantially the same width.

2. The device of claim 1, wherein the first gate pattern is part of a high-voltage transistor formed on the first region, and the second gate pattern is part of a low-voltage transistor formed on the second region.

3. The device of claim 1, wherein the first and second gate electrodes have top surfaces that are coplanar with a top surface of the interlayer insulating layer.

4. The device of claim 1, wherein the first gate pattern further comprises a first high-k dielectric pattern and the second gate pattern further comprises a second high-k dielectric pattern.

5. The device of claim 4, wherein the first and second high-k dielectric patterns comprise at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

6. The device of claim 1, wherein the first and second gate electrodes comprises at least one of titanium, titanium nitride, tantalum, tantalum nitride, tungsten, copper, aluminum, or mixtures thereof.

7. The device of claim 1 wherein
   top and bottom surfaces of the first gate pattern have substantially the same width, and
   a top width of the second gate pattern is larger than a bottom width thereof.

8. A semiconductor device, comprising:
   a substrate including a first region and a second region;
   a first gate pattern on the first region, the first gate pattern including a first gate insulating layer and a first gate electrode;
   a second gate pattern on the second region, the second gate pattern including a second gate insulating layer and a second gate electrode; and
   spacers provided on sidewalls of each of the first and second gate patterns,
   wherein a upper portion of each of the spacers of the first gate pattern has a width different from a upper portion of each of the spacers of the second gate pattern,
   top and bottom surfaces of the first gate pattern have substantially the same width, and
   a top width of the second gate pattern is larger than a bottom width thereof.

9. The device of claim 8, wherein a sidewall of the second gate pattern is tapered (inclined, slanted) compared to a sidewall of first gate pattern.

10. The device of claim 8, further comprising:
    an interlayer insulating layer on the substrate, wherein the first and second gate electrodes have top surfaces that are coplanar with a top surface of the interlayer insulating layer.

11. The device of claim 8, wherein the spacers comprise silicon nitride.

12. The device of claim 8, wherein the first and second gate electrodes comprise at least one of titanium, titanium nitride, tantalum, tantalum nitride, tungsten, copper, aluminum, or mixtures thereof.

13. The device of claim 8, the device of claim 1, wherein the first gate pattern further comprises a first high-k dielectric pattern and the second gate pattern further comprises a second high-k dielectric pattern.

14. The device of claim 13, wherein the first and second high-k dielectric patterns dispose on the sidewalls and bottom surfaces of the first and second gate electrodes, respectively.

15. The device of claim 8, wherein
    the spacers on the sidewalls of the first gate pattern define a trench,
    the first gate pattern is in the trench, and
    a top and a bottom of the trench have substantially the same width.

16. A semiconductor device, comprising:
    a substrate including a first region and a second region;
    a first gate pattern on the first region, the first gate pattern including a first gate insulating layer and a first gate electrode;

a second gate pattern on the second region, the second gate pattern including a second gate insulating layer and a second gate electrode; and an interlayer insulating layer enclosing the first and second gate patterns, wherein the first gate insulating layer is thicker than the second gate insulating layer, wherein the second gate pattern has a width increasing in a direction away from the substrate, and wherein top and bottom surfaces of the first gate pattern have substantially the same width.

17. The device of claim 16, wherein the first and second gate electrodes comprise at least one of titanium, titanium nitride, tantalum, tantalum nitride, tungsten, copper, aluminum, or mixtures thereof.

* * * * *